US009838783B2

(12) United States Patent
Ebenezer

(10) Patent No.: US 9,838,783 B2
(45) Date of Patent: Dec. 5, 2017

(54) ADAPTIVE PHASE-DISTORTIONLESS MAGNITUDE RESPONSE EQUALIZATION (MRE) FOR BEAMFORMING APPLICATIONS

(71) Applicant: Cirrus Logic International Semiconductor Ltd., Edinburgh (GB)

(72) Inventor: Samuel P. Ebenezer, Tempe, AZ (US)

(73) Assignee: Cirrus Logic, Inc., Austin, TX (US)

( * ) Notice: Subject to any disclaimer, the term of this patent is extended or adjusted under 35 U.S.C. 154(b) by 74 days.

(21) Appl. No.: 14/920,802

(22) Filed: Oct. 22, 2015

(65) Prior Publication Data

US 2017/0118555 A1 Apr. 27, 2017

(51) Int. Cl.

*H03G 5/00* (2006.01)
*H04R 3/00* (2006.01)
*G10L 19/025* (2013.01)
*G10L 19/04* (2013.01)

(52) U.S. Cl.

CPC ............ *H04R 3/005* (2013.01); *G10L 19/025* (2013.01); *G10L 19/04* (2013.01); *H04R 2430/21* (2013.01)

(58) Field of Classification Search

CPC ... H04R 3/005; H04R 2430/21; G10L 19/025; G10L 19/04

See application file for complete search history.

(56) References Cited

U.S. PATENT DOCUMENTS 7,274,794 B1 9/2007 Rasmussen
7,454,010 B1 11/2008 Ebenezer
8,855,330 B2 * 10/2014 Taenzer .................. H04R 1/10 381/74
2002/0049797 A1 * 4/2002 Temerinac ......... H03H 17/0294 708/319
2007/0223713 A1 * 9/2007 Gunness .............. H04R 29/003 381/59
2008/0192957 A1 8/2008 Kubo
2009/0136057 A1 5/2009 Taenzer
2011/0295599 A1 * 12/2011 Grancharov ............ G10L 21/00 704/211

FOREIGN PATENT DOCUMENTS

EP 1785007 A1 5/2007

OTHER PUBLICATIONS

Titchener et al., "A Linear Phase Adaptive Filter", reprinted from IEEE 1982 Conference Record of the 16th Asilomar Conference on Circuits, Systems & Computers, IEEE Computer Society Press, Silver Sring, Maryland.

* cited by examiner

*Primary Examiner* — Regina N Holder
(74) *Attorney, Agent, or Firm* — Norton Rose Fulbright US LLP

(57) ABSTRACT

A time domain impulse response filter may be used to equalize signals in the time domain to avoid error and artifacts that are introduced by domain transforms such as the IFFT. The disclosed time domain impulse response filter is based on the magnitude responses of the individual signals. The magnitude responses for each signal may be calculated in the frequency domain or with other techniques such as auto-regressive analysis and mathematical signal approximations algorithms, such as Padé approximations. An adaptive filter may then equalize the input sensor signals in their original time domain form using a filter calculated based on the processed signals.

22 Claims, 8 Drawing Sheets

ADAPTIVE PHASE-DISTORTIONLESS MAGNITUDE RESPONSE EQUALIZATION (MRE) FOR BEAMFORMING APPLICATIONS

FIELD OF THE DISCLOSURE

The instant disclosure relates to magnitude response equalization in multi-sensor systems. More specifically, portions of this disclosure relate to magnitude response equalization of signals from multiple microphone systems using adaptive filtering in the time domain.

BACKGROUND

Systems containing multiple microphones can detect directional sound by using beam forming techniques where the signals from at least two microphones are compared to observe phase shifts and magnitude differences. Processing signals from two different microphones capturing the same sounds requires equalization because the physical characteristics and magnitude responses may vary between microphones. These variations can exist even between microphones of the same make and model due to minor manufacturing variations. Variations can also be caused by many other factors, such as microphone boots, tube length differences, and other variations. Variations between microphones complicate processing signals from multiple microphone systems because applications, such as beam forming, assume that the differences in the signals measured at each microphone are attributable only to environmental and spacial differences, not differences in how the signals were measured. Accordingly, signal processing in multiple-microphone systems attempts to equalize the raw signals to improve the accuracy of signal processing calculations.

One conventional technique for equalizing is off-line calibration during system production. This technique requires manufacturing microphones with extremely low tolerance errors which increases the cost and sensitivity of the microphones. Another conventional technique for equalizing is self-calibration. On-line self-calibration using gain or magnitude response techniques include calculating propagation loss and phase matching. On-line self-calibration using frequency response techniques requires knowing the location of the control stimulus.

On-line self-calibration using magnitude response techniques generally operate by transforming the time domain signals for each microphone (e.g., two signals from two separate microphones) into the frequency domain and then calculating an equalization ratio based on the first and second signals across the frequency range. The equalization ratio is then applied to the frequency domain of the second signal in an attempt to match it to the first microphone. The adjusted second signal is then transformed back into the time domain, and further processing, such as beam forming calculations, may be performed with the first and second signals. This technique reduces the error introduced by variations in the two microphones, but introduces additional error in the equalization computations.

Manipulating the frequency domain of the second signal using the calculated equalization ratio across all frequencies and then converting back to the time domain introduces error in calculations. The magnitude response of the microphones varies across frequencies such that the calculated equalization ratio only approximates the magnitude differences of the two signals and does not account for varied magnitude responses of the different microphones at different frequencies. Furthermore, the signal generated by the Inverse Fast Fourier Transform (I-FFT) when converting the adjusted second signal from the frequency domain back to the time domain inherently introduces error because of the mathematical limitations of I-FFTs. Such a conventional technique is illustrated in FIG. 1, in which the frequency domain signal for $x_2[n]$ is taken from node 101, after conversion to frequency domain at block 105, and equalized at amplifier 102 using the ratio of the frequency domain responses calculated at processing block 103. The equalized frequency response of $x_2[n]$ is then transformed in I-FFT block 104.

Shortcomings mentioned here are only representative and are included simply to highlight that a need exists for improved electrical components, particularly for multiple microphone systems employed in consumer-level devices, such as mobile phones. Embodiments described herein address certain shortcomings but not necessarily each and every one described here or known in the art.

SUMMARY

Magnitude response equalization of multiple sensor systems may be improved by using a time domain impulse response filter that is based on the magnitude responses of the individual signals to equalize the magnitude response of multiple microphones across the desired frequency spectrum. Conventional techniques equalize signals in the frequency domain which creates errors and artifacts that propagate into the time domain representation of an equalized signal when the equalized signal is transformed from the frequency domain into the time domain. The methods and apparatuses described herein reduce or eliminate the signal error introduced by conventional frequency domain equalization techniques by creating a time domain impulse response filter that equalizes signals in the time domain. Thus, avoiding the error and artifacts that are introduced by domain transforms such as the I-FFT. Further, the signal processing is constrained to reduce or prevent introduction of phase differences between input signals.

In some embodiments, a time domain impulse response filter is based on the magnitude responses of the individual signals and used to equalize the magnitude response of multiple microphones across the desired frequency spectrum. The magnitude responses for each signal may be calculated in the frequency domain or with other techniques, such as auto-regressive analysis and mathematical signal approximations algorithms like Padé approximations. Applying the time domain impulse response filter based on the magnitude response of the system's microphones in the time domain to equalize a second microphone with a first microphone avoids the error introduced in prior art systems where equalization of the second signal is done in the frequency domain.

According to one embodiment, a method may include receiving, by a processor coupled to a plurality of sensors, at least a first input signal and a second input signal in a time domain from the plurality of sensors; converting, by the processor, the first and second input signals from the time domain to a frequency domain input signal; estimating, by the processor, a magnitude response difference between the first and second input signals based, at least in part, on the frequency domain input signal; converting, by the processor, the magnitude response difference into a time domain impulse response; constraining, by the processor, the time domain impulse response to have a linear phase response; and/or filtering, by the processor, at least one of the first input signal and the second input signal based, at least in part, on the constrained time domain impulse response.

In certain embodiments, the step of filtering may include equalizing a magnitude response between the first input signal and the second input signal received from the plurality of sensors; the step of estimating the magnitude response difference comprises calculating filter coefficients for an adaptive filter, wherein the step of constraining may include constraining the filter coefficients to be even symmetric and odd length, and wherein the step of filtering comprises applying the adaptive filter with the calculated and constrained filter coefficients.

In some embodiments, the method may further include the steps of repeating the steps of receiving, estimating, converting, constraining, and filtering to provide adaptive equalization of the received input signals; delaying at least one of the first input signal and the second input signal that is not filtered based on the constrained time domain impulse response to compensate for a delay introduced by the filtering; the first input signal and the filtered second input signal may be further filtered for spatial recognition; and/or the first input signal and the filtered second input signal may be further filtered for beamforming.

According to another embodiment, an apparatus may include a first input node configured to receive a first input signal; a second input node configured to receive a second input signal; and/or a controller coupled to the first input node and coupled to the second input node. The controller may be configured to perform certain steps including receiving the first input signal and the second input signal in a time domain; converting the first and second input signals from the time domain to a frequency domain input signal; estimating a magnitude response difference between the first and second input signals based, at least in part, on the frequency domain input signal; converting the magnitude response difference into a time domain impulse response; constraining the time domain impulse response to have a linear phase response; and/or filtering at least one of the first input signal and the second input signal based, at least in part, on the constrained time domain impulse response.

In some embodiments, the controller may perform the step of filtering by equalizing a magnitude response between the first input signal and the second input signal received from the plurality of sensors; and/or may perform the step of estimating the magnitude response difference by calculating filter coefficients for an adaptive filter, wherein the step of constraining comprises constraining the filter coefficients to be even symmetric and odd length, and wherein the step of filtering comprises applying the adaptive filter with the calculated and constrained filter coefficients.

In certain embodiments, the controller may also be configured to repeat the steps of receiving, estimating, converting, constraining, and filtering to provide adaptive equalization of the received input signals; and/or configured to delay at least one of the first input signal and the second input signal that is not filtered based on the constrained time domain impulse response to compensate for a delay introduced by the filtering.

According to another embodiment, a method may include receiving, by a processor from a plurality of sensors, at least a first input signal and a second input signal in a time domain; computing, by the processor, an auto-regressive (AR) model parameters of the input signals using linear prediction analysis; computing, by the processor, an auto-regressive moving average (ARMA) model parameters corresponding to the magnitude response difference between the two input signals; computing, by the processor, a time domain impulse response corresponding to a magnitude response difference between the first input signal and second input signal where the magnitude response difference is calculated using a Padé approximation based, at least in part, on the auto-regressive model parameters and the auto-regressive moving average model parameters; constraining, by the processor, the time domain impulse response to have a linear phase response; and/or filtering, by the processor, at least one of the first input signal and the second input signal based, at least in part, on the constrained time domain impulse response.

In certain embodiments, the step of applying the linear prediction analysis may include generating linear prediction coefficients; and/or the first input signal and the second input signals may include audio information.

In yet a further embodiment, an apparatus may include a first input node configured to receive a first audio signal; a second input node configured to receive a second audio signal; and/or a controller coupled to the first input node and coupled to the second input node. The controller may be configured to perform steps including receiving the first input signal and the second input signal in a time domain; computing, by the processor, the auto-regressive (AR) model parameters of the input signals using linear prediction analysis; computing, by the processor, the auto-regressive moving average (ARMA) model parameters corresponding to the magnitude response difference between the two input signals; computing, by the processor, a time domain impulse response corresponding to a magnitude response difference between the first input signal and second input signal where the magnitude response difference is calculated using a Padé approximation based, at least in part, on the auto-regressive model parameters and the auto-regressive moving average model parameters; constraining the time domain impulse response to have a linear phase response; and/or filtering at least one of the first input signal and the second input signal based, at least in part, on the constrained time domain impulse response.

In certain embodiments, the controller may be configured to apply the linear prediction analysis by generating linear prediction coefficients; the first input signal and the second input signals may include audio information; and/or the audio information may be audio information received from a first microphone and a second microphone.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Figure 6A:
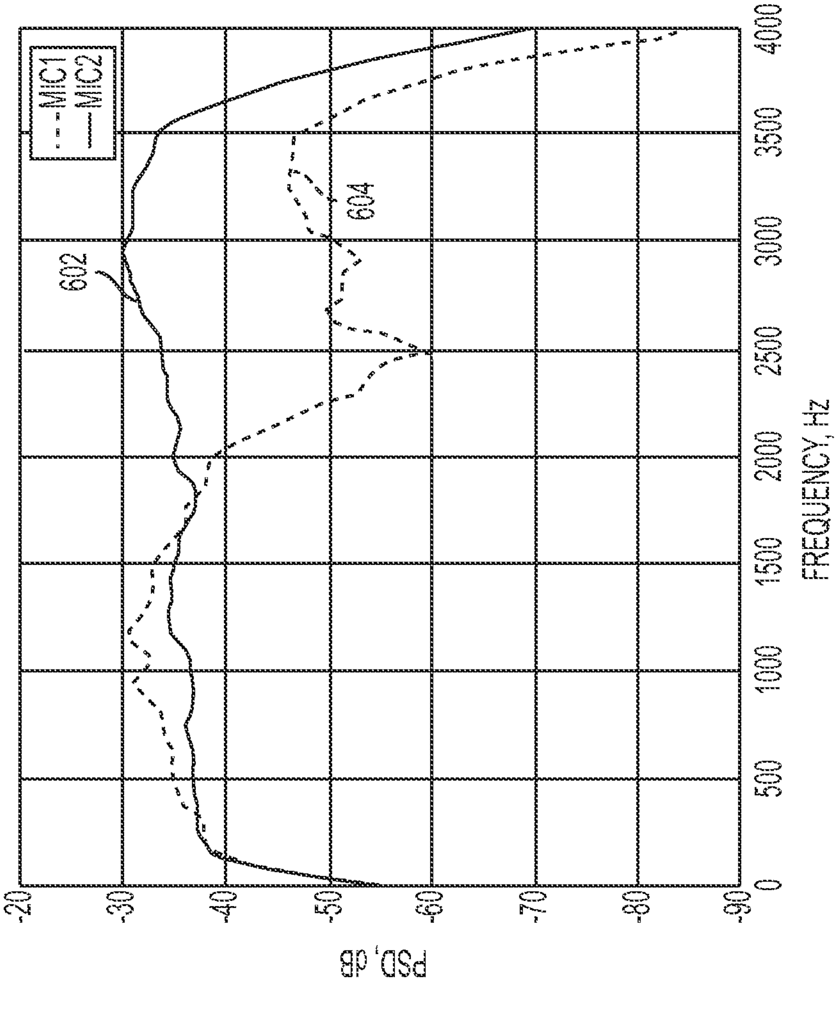
FIG. 6A is an example graph illustrating the magnitude response of two microphones without equalization according to one embodiment of the disclosure.

An example of the inconsistencies and variations in the magnitude response of different microphones in a multiple microphone system that can be addressed with embodiments of this disclosure are shown in FIG. 6A. The graph of FIG. 6A illustrates a magnitude response of two microphones to a control signal in lines 602 and 604. Due to microphone mismatches that may arise, for example, during manufacturing, the microphones respond differently to a stimulus at each frequency. Equalizing one microphone's response to the other microphone's response may improve the processing of audio captured by the microphones, such as user speech. In some embodiments, a time domain impulse response filter may be applied during equalization of the signals.

Figure 1:
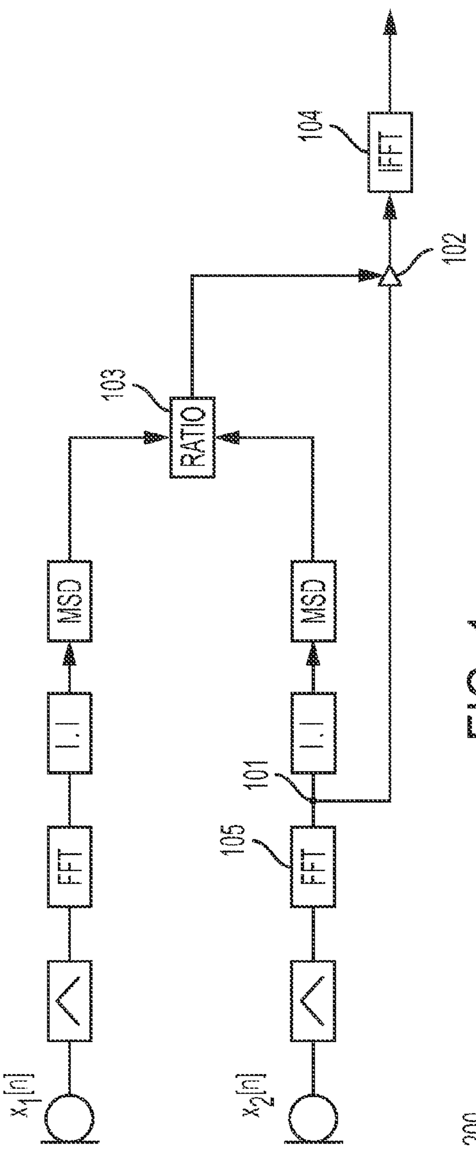
FIG. 1 PRIOR ART
FIG. 1 is an example block diagram of a system for equalizing a second signal to a first in the frequency domain according to the prior art.
Figure 2:
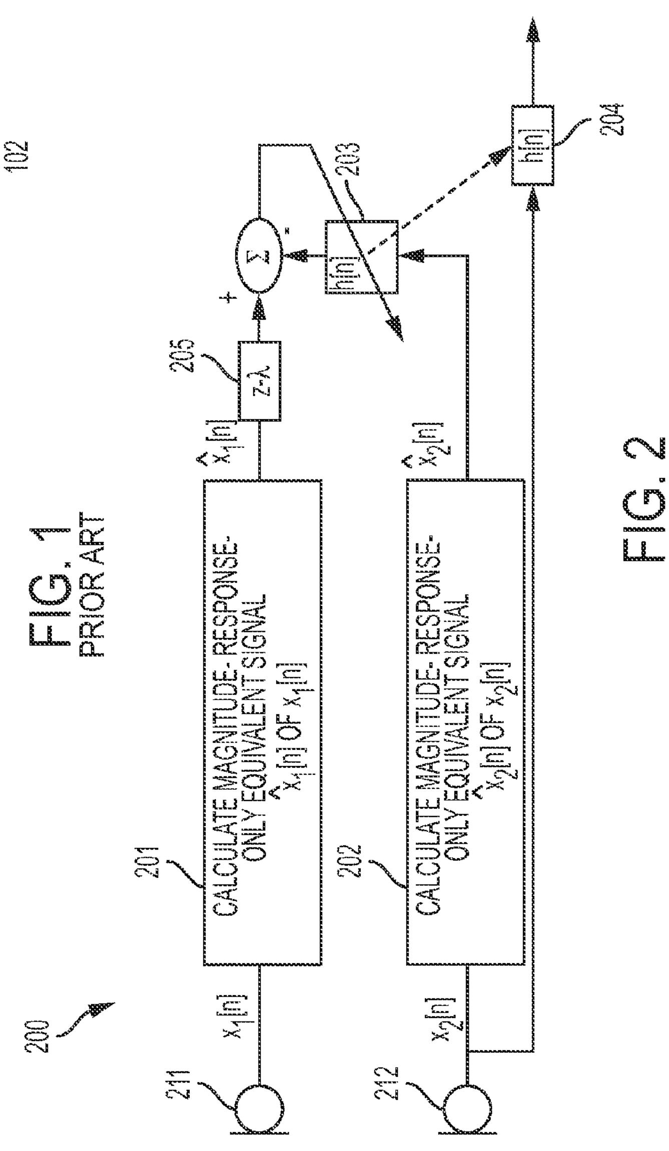
FIG. 2 is an example block diagram of an adaptive filter for equalizing a second signal to a first signal in the time domain in which the adaptive filter is based on the magnitude response of the first and second signals.

Referring now to FIG. 2, one technique for equalizing magnitude response of two microphones is shown. FIG. 2 shows such an example system 200 for implementing magnitude response equalization with an adaptive filter according to one embodiment of the disclosure. Input signals $x_1[n]$ and $x_2[n]$, such as time domain audio signals from a first and second microphone, are received at input nodes 211 and 212 of the signal processing system 200. The signals $x_1[n]$ and $x_2[n]$ are provided to processing blocks 201 and 202, which calculate a magnitude response for each time domain signal. The calculated magnitude responses $\widehat{x_1}[n]$ and $\widehat{x_2}[n]$ are then used in processing block 203 to calculate a constrained time domain impulse response filter 204. The constrained time domain impulse response filter, h[n], is then applied to one of the time domain input signals by filter 204 to equalize the first signal $x_1[n]$ from a first sensor to the second signal $x_2[n]$ from a second sensor. In one embodiment, a delay block 205 may be inserted after a magnitude response calculation, such as that of processing block 201, to compensate for delay introduced by filter 204.

Although the signals $x_1[n]$ and $x_2[n]$ are described in certain embodiments as being microphone signals, such as those received from digital microelectromechanical systems (MEMS) microphones, any sensor signals may be processed with the systems and methods described herein. The input signals $x_1[n]$ and $x_2[n]$ may be digital signals in a time domain representation. Input signals $x_1[n]$ and $x_2[n]$ may be received from memory, buffers, or directly from analog-to-digital converters (ADCs) that are coupled to the sensors or microphones.

Figure 3:
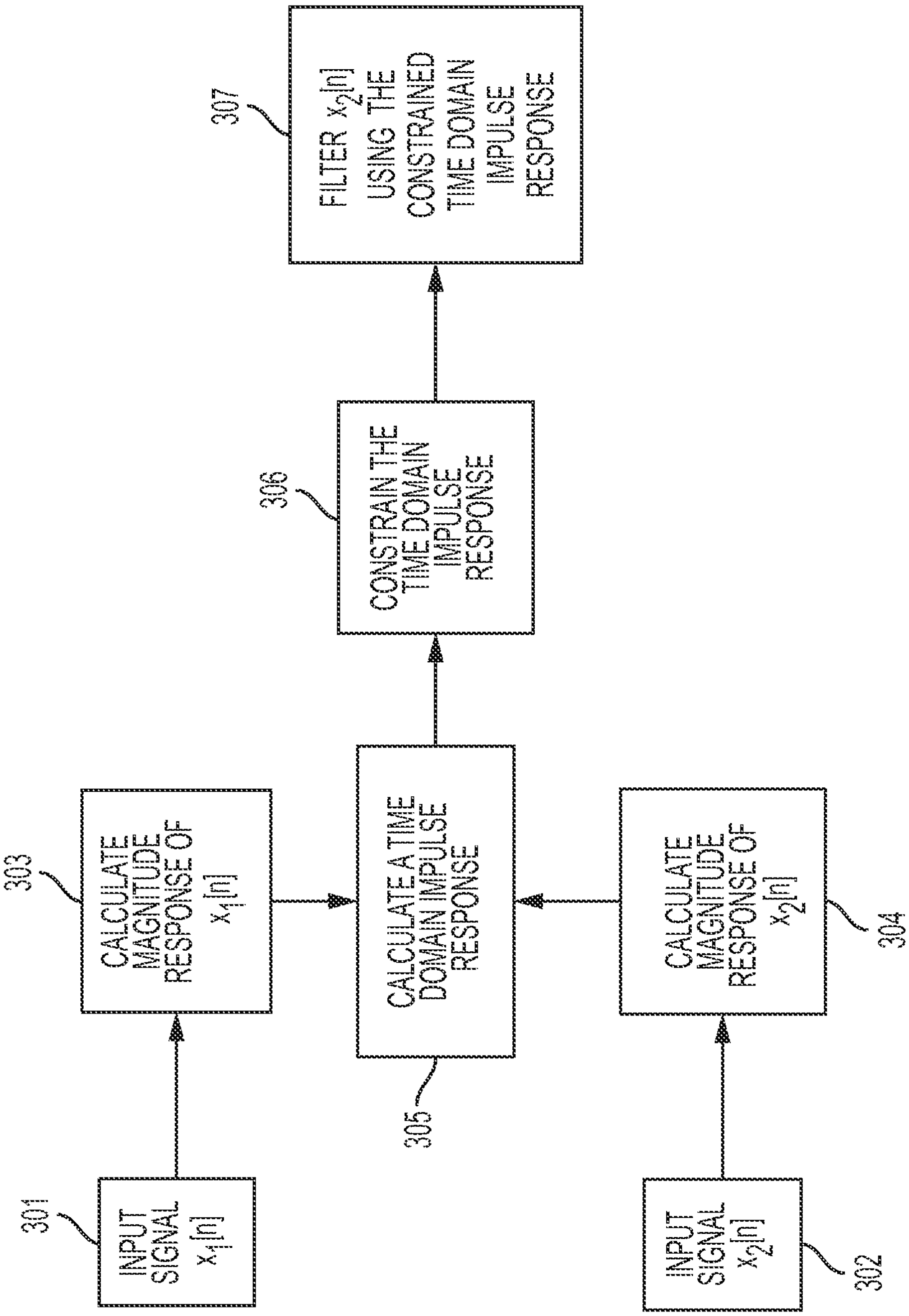
FIG. 3 is an example flow chart of illustrative steps for equalizing a second signal to a first signal in the time domain with an adaptive filter based on the magnitude response of the first and second signals according to one embodiment of the disclosure.

The magnitude response equalization of FIG. 2 may provide better matching of unmatched microphones because equalization of the second microphone signal to the first signal is performed using a filter in the time domain based on the magnitude response of both microphones. This matching reduces error introduced in prior art systems where equalization of the second microphone is traditionally performed in the frequency domain and then the equalized second microphone signal is transformed from the frequency domain to the time domain. FIG. 3 is an example signal processing flow for matching magnitude response in the time domain according to one embodiment of the disclosure. Time domain input signals $x_1[n]$ and $x_2[n]$ are received at blocks 301 and 302, respectively, from input nodes. The magnitude response for each of signals $x_1[n]$ and $x_2[n]$ is calculated at blocks 303 and 304, respectively. The magnitude responses of each signal can be estimated in either the time domain or in the frequency domain or a combination of the two. After calculating a magnitude response at blocks 303 and 304, a time domain impulse response based on the calculated magnitude responses is calculated at block 305. Because the time domain impulse response might include some phase distortion, the time domain impulse response may be constrained in block 306. The constrained time domain impulse response is then applied, at block 307, to one of the input signals, e.g., $x_2[n]$, to filter the signal and equalize the microphone response of the microphone receiving signal $x_2[n]$ to the microphone receiving signal $x_1[n]$.

The constraining of the time domain impulse response results in a minimal or zero introduction of phase distortion to the signals $x_1[n]$ or $x_2[n]$. Beamforming, and other signal processing techniques, calculate parameters based on the time difference of arrival of signals received at the microphones. This time difference of arrival information can be altered if phase information of the microphone signals is distorted by signal processing techniques. By constraining the impulse response, the phase distortion may be reduced or eliminated such that no noticeable effect on the later signal processing occurs. For example, beamforming relies on phase difference information between the microphone signals $x_1[n]$ and $x_2[n]$ to form a beam or a null in a particular direction. Constraining the response at block 307 allows the beam forming or null forming to operate with reduced error.

Signals used to create the magnitude response equalization filter, e.g., the filter at block 307 of FIG. 3 and filter h[n] of the processing block 204 of FIG. 2, can include any signal. In some embodiments, the signal can be processed to create a uniform magnitude across desired frequency ranges, e.g., white noise. However, the magnitude response equalization may be applied at any time with any input signal and does not require a control signal with a uniform magnitude response across frequency ranges.

Figure 4:
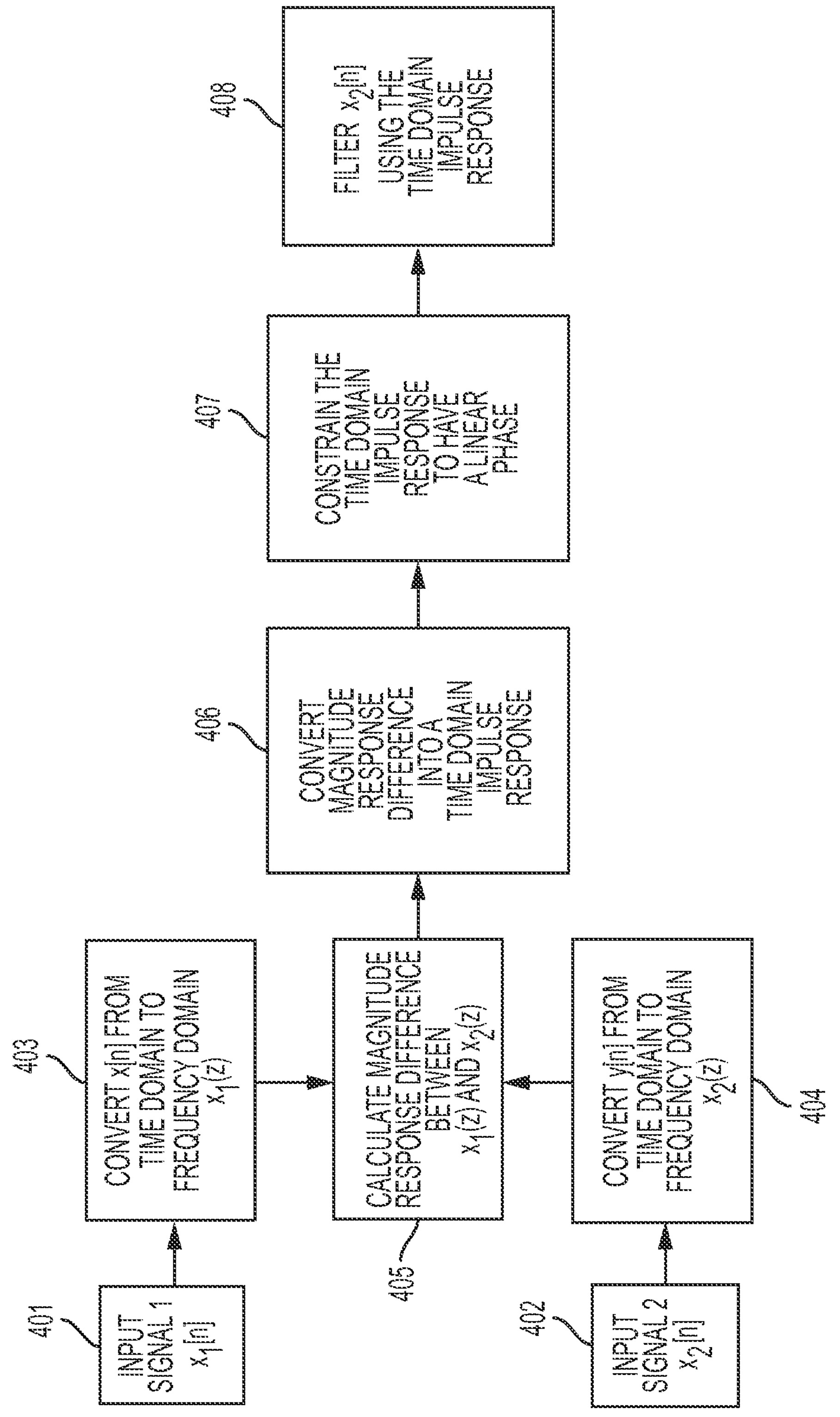
FIG. 4 is an example flow chart of illustrative steps for equalizing a second signal to a first signal in the time domain with an adaptive filter based on a magnitude response of the first and second signals that is calculated in the frequency domain according to one embodiment of the disclosure.

In some embodiments, the magnitude response equalization applied in creating the adaptive filter may be calculated using frequency domain representations of the signals. FIG. 4 is an example signal processing flow for matching magnitude response in the time domain according to one embodiment of the disclosure in which the adaptive filter is based on the magnitude response of the signals in the frequency domain according to one embodiment of the disclosure. In the example flow of FIG. 4, at least two signals from at least two separate sensors are received at blocks 401 and 402. In some embodiments, the two signals $x_1[n]$ and $x_2[n]$ are received in the time domain from a first and second sensor, respectively. Input signals $x_1[n]$ and $x_2[n]$ are then converted into the frequency domain at blocks 403 and 404, respectively. The frequency domain representations of signals $x_1[n]$ and $x_2[n]$ are shown as frequency domain representations $X_1(z)$ and $X_2(z)$, respectively, at blocks 403 and 405, but other frequency domain representations may be used in some embodiments. The magnitude response difference between the frequency domain representations $X_1(z)$ and $X_2(z)$ is calculated at block 405. The magnitude response difference includes coefficients that represent the difference in magnitude response for sensor 1 and sensor 2 at several frequencies. The magnitude response difference is then converted into a time domain impulse response filter, h[n], at block 406. In some embodiments, the filter h[n] is an adaptive filter. In some embodiments, the time domain impulse response filter, h[n], is constrained at block 407 to have a linear phase to prevent phase distortions when applying the filter h[n] to an input signal. The filter h[n] is then applied to one of the input signals, e.g., signal $x_2[n]$, at block 408.

Figure 5:
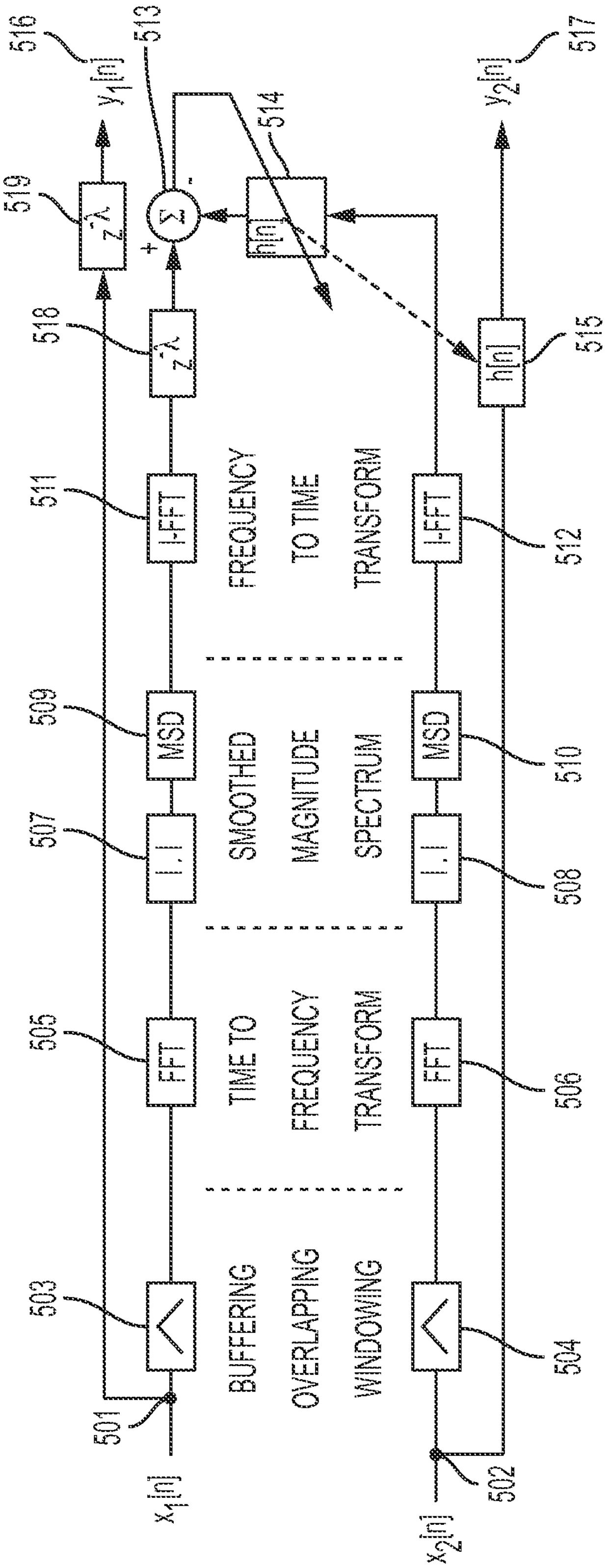
FIG. 5 is an example block diagram of an adaptive filter for equalizing a second signal to a first signal in the time domain with an adaptive filter based on a magnitude response of the first and second signals that is calculated in the frequency domain according to one embodiment of the disclosure.

An adaptive filter may be calculated after frequency domain conversion of the signals as shown in the system of FIG. 5. The system of FIG. 5 receives input signals $x_1[n]$ and $x_2[n]$ at nodes 501 and 502 from a first and second sensor, such as two microphones. Nodes 501 and 502 are coupled to respective processing blocks 503 and 504, where the time domain signals $x_1[n]$ and $x_2[n]$ may be buffered, windowed, and/or overlapped. Processing blocks 503 and 504 are coupled to respective Fast Fourier Transform (FFT) processing blocks 505 and 506 where input signals $x_1[n]$ and $x_2[n]$ are transformed into the frequency domain. FFT processing block 505 is coupled to magnitude smoothing blocks 507 and 509, and FFT processing block 506 is coupled to magnitude smoothing blocks 508 and 510. The magnitude smoothing blocks may estimate the magnitude spectral density (MSD) using any one of the following methods: mean squared displacement (shown in processing blocks 509 and 510), the Cepstrum method, running average filtering. Savitzky-Golay smoothing, or other smoothing algorithms. Magnitude smoothing blocks 507-510 may perform magnitude smoothing with software or in hardware. Magnitude smoothing in hardware components may be accomplished with, for example, a low-pass or bandpass filter.

After this processing in the frequency domain, the signals may be converted back to time domain and used to generate coefficients for adaptive filters blocks 514 and 515. Magnitude smoothing blocks 507 and 509 are thus coupled to Inverse-Fast Fourier Transform (I-FFT) block 511 and magnitude smoothing blocks 508 and 510 are coupled to I-FFT block 512. The I-FFT blocks 511 and 512 produce signals $\hat{x}_1[n]$ and $\hat{x}_2[n]$, respectively, which are time domain representations of the smoothed magnitude spectrums of the microphone signals $x_1[n]$ and $x_2[n]$, respectively. I-FFT block 511 is coupled to an error signal processing block 513, which is coupled to adaptive filter 514. The adaptive filter 514 is also coupled to I-FFT processing block 512 to receive $\hat{x}_2[n]$. The adaptive filter 514 produces FIR coefficients for the filter h[n] and may be further coupled to the error signal processing block 513 to create a feedback loop where filter h[n] is an input to the error signal processing block 513. The error signal feedback to the adaptive filter 514 refines the FIR coefficients for the filter h[n] of the adaptive filter to obtain convergence of $\hat{x}_1[n]$ and $\hat{x}_2[n]$. The same coefficients can be applied by adaptive filter 515, which applies the filter to one of the time domain signals $x_1[n]$ and $x_2[n]$.

In some embodiments, I-FFT processing block 511 is further coupled to a delay block 518 between the I-FFT block 511 and error signal processing block 513 that imposes a delay, e.g., a simple delay, λ, created by the filter h[n] such that $\hat{x}_1[n-\lambda]$ is the output of delay block 518 and $\hat{x}_1[n-\lambda]$ is synchronized with the $\hat{x}_2[n]$ that has passed through adaptive filter 514 when the error signal is calculated in error signal processing block 513.

Referring back to processing blocks 503 and 504, the blocks 503 and 504 may process the input signals by buffering, overlapping, and/or windowing the signals and then converting to the frequency domain based on the following equation:

$$X_i[l,m]=\sum_{n=0}^{N-1} w[n]x_i[n,m]e^{\frac{-j2\pi nl}{N}},$$

$$i=1,2,\ l=0,1,\ \ldots\ ,N-1,$$

where w[n] is the windowing function, $x_i[n,m]$ is the buffered and overlapped input signal corresponding to the mth superframe, N is the FFT size that can be changed through a tunable parameter, and l is the frequency bin index. The overlap may be fixed at 50%, and the Kaiser-Bessel derived window may be used in this analysis stage. The performance of the magnitude response equalization systems and methods as a whole are not limited by the window function. In some embodiments, a window other than a rectangular window may be applied.

Referring now to processing blocks 507, 508, 509, and 510, the magnitude spectrum may be computed from the complex frequency spectrum and smoothed using the first order exponential averaging filter based on the following equation:

$$M_i[l,m]=\alpha M_i[l,m-1]+(1-\alpha)|X_i[l,m]|,$$

where α is a smoothing parameter that can be changed by a user or an algorithm executing on a processor.

The smoothed magnitude spectrum may then be transformed to the time domain using the inverse Fourier transform in blocks 511 and 512 based on the following equation:

$$\hat{x}_i[n,m]=\sum_{i=0}^{N-1} M_i[l,m]e^{\frac{j2\pi nl}{N}},$$

-continued $$i = 1, 2, n = 0, 1, \ldots, N-1.$$

The output signal $\hat{x}[n]$ can be interpreted by assuming that the input signal $x_i[n]$ is obtained by filtering a white noise signal by a coloring filter $g_i[n]$.

For a wide sense stationary system (WSS), $$P_{x_i}(f)=|G_i(f)|^2 W(f)$$

where $Px_i(f)$ is the power spectral density of the input signal $x_i[n]$, $G_i(f)$ is the frequency response of the coloring filter and W(f) is the frequency response of the excitation white noise signal. With the WSS assumption, the output signal $\hat{x}_i[n]$ can be written as $$\hat{x}_i[n, m] = \sum_{i=0}^{N-1} |G_i[l]| e^{\frac{j2\pi nl}{N}}, \quad i = 1, 2.$$

Thus the signal x̂i[n] contains only the magnitude response information of the coloring filter $g_i[n]$. The goal of the MRE system and methods is to estimate the magnitude response of the coloring filters and design an equalization filter that matches the magnitude response of one of the coloring filters to the other. The magnitude response of this equalization filter can be:

$$|H(f)| = \frac{|G_1(f)|}{|G_2(f)|}.$$

The magnitude difference compensation can be implemented in the frequency domain by multiplying the complex spectrum of one of the microphone signals by a real gain function, as is done in the prior art. However, this scaling in frequency domain can introduce artifacts in the synthesized time domain signal. The embodiments described herein instead perform equalization through a time domain filter, e.g., an FIR filter. The filter coefficients are estimated through an adaptive filter that operates on the time domain representation of the smoothed magnitude spectrum of the microphone signals. In some embodiments, the magnitude response equalization block may equalize only for magnitude response differences. Therefore, the coefficients may be updated in such a manner in which the phase response of the filter is constrained to be linear. This linear phase response can translate to introduction of a simple delay at the equalized output. The reference to the adaptive filter is defined as:

$$x_k=[\hat{x}_2[k]\hat{x}_2[k-1] \ldots \hat{x}_2[k-L+1]]^T,$$

where L is the number of filter coefficients that can be tuned through an input parameter. The error signal is then given by the following equation:

$$e[k]=\hat{x}_1[k-\lambda]-h_k^T x_k,$$

where $\hat{x}_1[k-\lambda]$ is the delayed version of the signal whose magnitude spectrum must be matched by the reference signal filtered by the filter coefficients $h_k$. The filter coefficients for an unconstrained adaptive filter may be obtained using the normalized least mean squares (NLMS) recursive update equation as:

$$h_{k+1} = h_k + \frac{\mu}{x_k^T x_k + \delta} e[k] x_k,$$

where δ is a small regularization factor to prevent division by zero. The linear phase constrained adaptive filter update equation may be obtained by modifying the above equation through exploiting the coefficient symmetry properties of a linear phase FIR filter. The moving average form of a FIR filter may be given by the following equation:

$$\hat{y}[k]=h_k[0]\hat{x}_2[k]+h_k[1]\hat{x}_2[k-1]+h_k[2]\hat{x}_2[k-2]+ \ldots +h_k[L-1]\hat{x}_2[k-L+1].$$

For a Type I linear phase FIR system, the coefficients may be constrained to be even symmetric and odd length as defined in the following equation:

$$h[n]=h[L-1-n], \quad 0 \le n \le L-1,$$

and the delay introduced by this filter may be (L−1)/2 samples. The output of this filter can be defined as $$\hat{y}[k] = \sum_{i=0}^{\frac{L-1}{2}-1} h_k[i]\{\hat{x}_2[k-i] + \hat{x}_2[k-L+1+i]\} + h_k\left[\frac{L-1}{2}\right]\hat{x}_2\left[k - \frac{L-1}{2}\right].$$

Thus, by rearranging the reference buffer, the linear phase FIR filter coefficients can be estimated using the standard NLMS update equation. Specifically, the reference vector and the coefficient vector may be reduced to:

$$x_k^{(lp)} = \left[\{\hat{x}_2[k] + \hat{x}_2[k-L+1]\}\{\hat{x}_2[k-1] + \hat{x}_2[k-L+2]\} \ldots \hat{x}_2\left[k - \frac{L-1}{2}\right]\right]^T,$$

$$h_k^{(lp)} = \left[\, h_k[0] \quad h_k[1] \quad \ldots \quad h_k\left[\frac{L-1}{2}\right] \right]^T.$$

The number of unique coefficients in a Type I linear phase filter may be ((L−1)/2+1). In some embodiments, only these unique coefficients may be estimated. The NLMS update equation for a linear phase constrained FIR filter can be modified as shown in the following equation:

$$h_{k+1}^{(lp)} = h_k^{(lp)} + \frac{\mu}{x_k^{(lp)T} x_k^{(lp)} + \delta} e[k] x_k^{(lp)}.$$

The delay λ may be set to (L−1)/2 samples to derive the error signal. The adaptation rate may then be tuned through a tunable parameter, selected by a user or determined by a processor. The auto-correlation of the signal $\hat{x}_i[n]$ may be the same as the input signal $x_i[n]$, as shown in the following equation:

$$r_{x_i x_i}[p]=r_{\hat{x}_i \hat{x}_i}[p],$$

where p is the auto-correlation lag index. This relationship means the convergence properties of the adaptive filter that is implemented based on the signals $\hat{x}[n]$ may be governed by the auto-correlation properties of the original input signals $x_i[n]$.

When the equalization filter coefficients is estimated from the time domain equivalent of the magnitude spectrum, the filter may be separately applied on the raw input signal $x_2[n]$. Specifically, the equalized output may be defined by the following equation:

$$y_2[k] = \sum_{i=0}^{\frac{L-1}{2}-1} h_k^{(lp)}[i]\{x_2[k-i] + x_2[k-L+1+i]\} + h_k^{(lp)}\left[\frac{L-1}{2}\right]x_2\left[k-\frac{L-1}{2}\right].$$

The unequalized input may be delayed to compensate for the delay introduced by the linear phase FIR filter given by the following equation:

$$y_1[k] = x_1\left[k-\frac{L-1}{2}\right].$$

The output of delay block 518 may be $y_1[n]$, and the output of adaptive filter 514 may be $y_2[n]$. The signals $y_1[n]$ and $y_2[n]$ may be further filtered for beamforming applications (e.g., beamforming or spatial filtering). For example, beamforming with $y_1[n]$ and $y_2[n]$ may include filtering the signals $x_1[n]$ and $x_2[n]$. Filtering the signals $x_1[n]$ and $x_2[n]$ to alter the phase or magnitude of at least one of the signals $x_1[n]$ and $x_2[n]$ may be used to amplify or nullify signals within the signals $x_1[n]$ and $x_2[n]$. In some embodiments, beamform filtering using $y_1[n]$ and $y_2[n]$ may be used to detect the location of the signal source by calculating, for example, magnitude and phase shift differences between $y_1[n]$ and $y_2[n]$ caused, at least in part, by the spatial relationship between the sensors that produce signals $x_1[n]$ and $x_2[n]$.

Figure 6B:
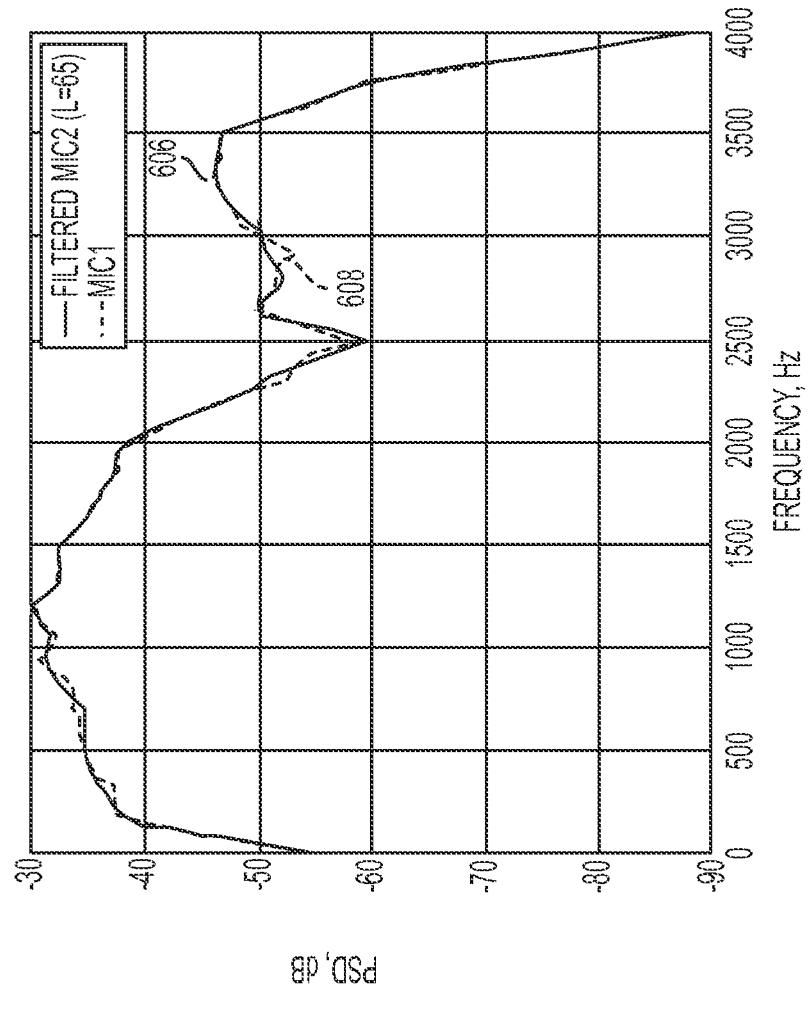
FIG. 6B is an example graph illustrating the magnitude response of two microphones after applying the magnitude response equalization techniques according to one embodiment of the disclosure.

FIG. 6A illustrates the spectral plot of two input sensors, labelled Mic1 and Mic2. This figure highlights the problem addressed by the systems and methods disclosed herein. Signal comparisons between the data of two sensors with different spectral responses, such as Mic1 and Mic2 in FIG. 6A, must be equalized to perform further processing on the signals, such as beam forming. FIG. 6B illustrates the spectral plot of the raw data of Mic1 plotted with the spectral plot of the filtered raw data from Mic2, where the Mic2 raw data has been filtered using one embodiment of the systems and methods described herein. As shown in FIG. 6B, the filtered Mic2 signal 606 is equalized across the relevant frequency spectrum to match the magnitude response of Mic1 signal 608. Comparative signal analysis between Mic1 and Mic2 may be enhanced by the embodiments herein by removing signal processing errors that would otherwise be caused by the inherent or environmental differences in the first and second microphones producing signals Mic1 and Mic2.

In some environments, the input signal consists of noise and speech and the relative magnitude spectrum of the speech and the noise can be very different. In such scenarios, matching the magnitude spectrum at all times may cause undesirable results. Accordingly, some embodiments further include an adaptive enable input signal that controls the time instances in which the smoothed magnitude spectrum estimation is enabled. The adaptive filter may be updated only when the adaptive enable input signal control signal is true because the input signals $\hat{x}[n]$ changes only when the smoothed magnitude spectrum estimation is enabled.

Figure 7:
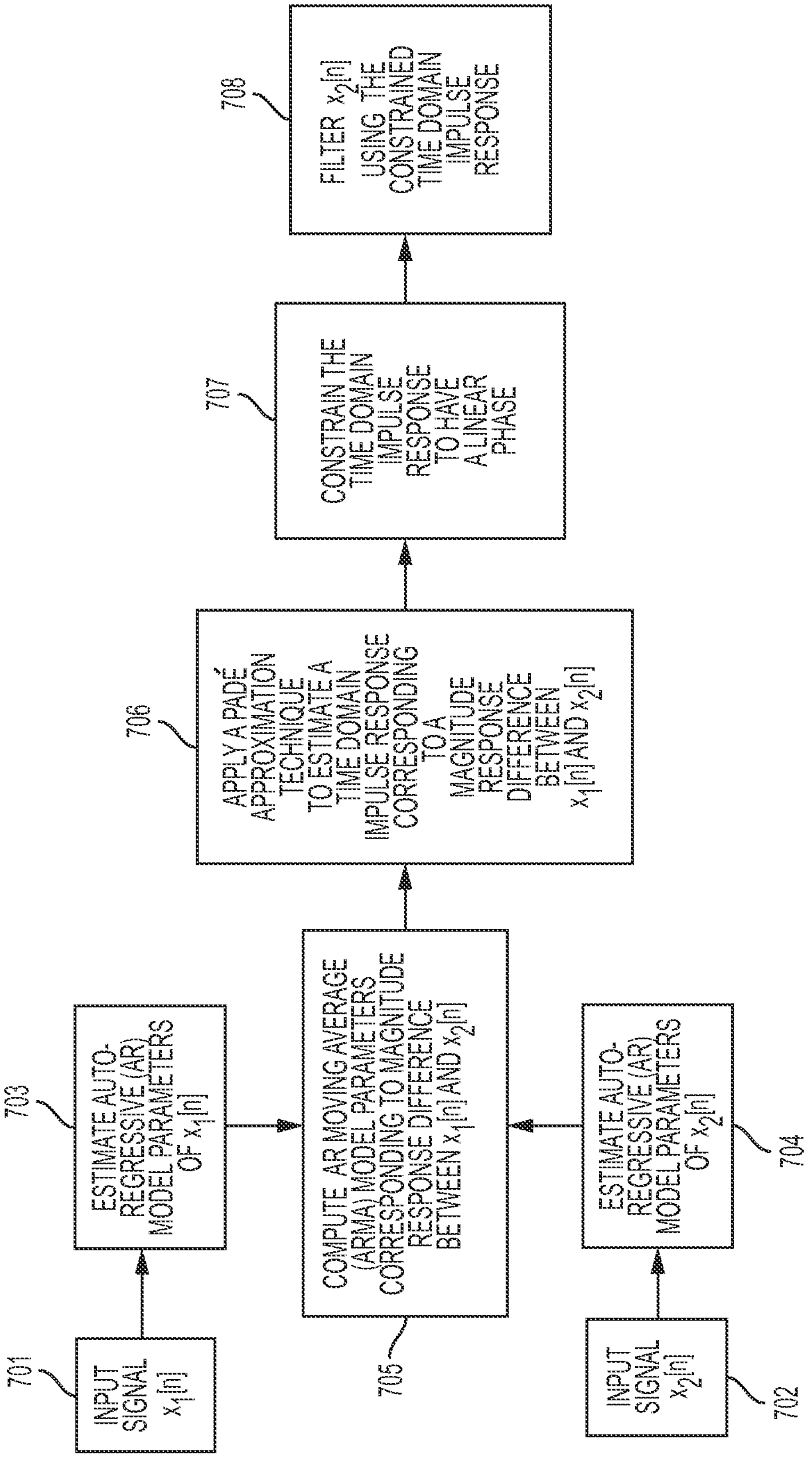
FIG. 7 is an example flow chart of illustrative steps for equalizing a second signal to a first signal in the time domain with an adaptive filter based on a magnitude response of the first and second signals that is calculated in the time domain using auto-regressive modeling according to one embodiment of the disclosure.

In some embodiments, the magnitude response used in creating the adaptive filter for equalizing signals in the time domain may be calculated using statistical approximations of the time domain representations of the signals. FIG. 7 is an example signal processing flow for matching magnitude response in the time domain according to one embodiment of the disclosure. The adaptive filter may be, for example, based on the magnitude response of the signals found using auto-regressive techniques and a Padé approximation. FIG. 7 illustrates an embodiment of the methods of the present invention where input signals $x_1[n]$ and $x_2[n]$ are received at blocks 701 and 702, respectively. Block 703 calculates an estimate of Auto-Regressive (AR) model parameters of signal $x_1[n]$, and block 704 calculates an estimate of the AR model parameters of signal $x_2[n]$. Next, the Auto-Regressive Moving Average (ARMA) model parameters are calculated at block 705 to correspond to the magnitude response difference between signals $x_1[n]$ and $x_2[n]$. The ARMA model parameters may then be used at block 706 to estimate a time domain impulse response that corresponds to a magnitude response difference between input signals $x_1[n]$ and $x_2[n]$. The estimated time domain impulse response may be constrained to create a time domain impulse response filter with a linear phase. One of the signals, such as $x_2[n]$, is then filtered at block 708 using the constrained time domain impulse response calculated at blocks 706 and 707. Additionally, the unfiltered signal, $x_1[n]$, may be delayed in some embodiments to compensate for delay caused by the time domain impulse response filter applied at block 708.

Figure 8:
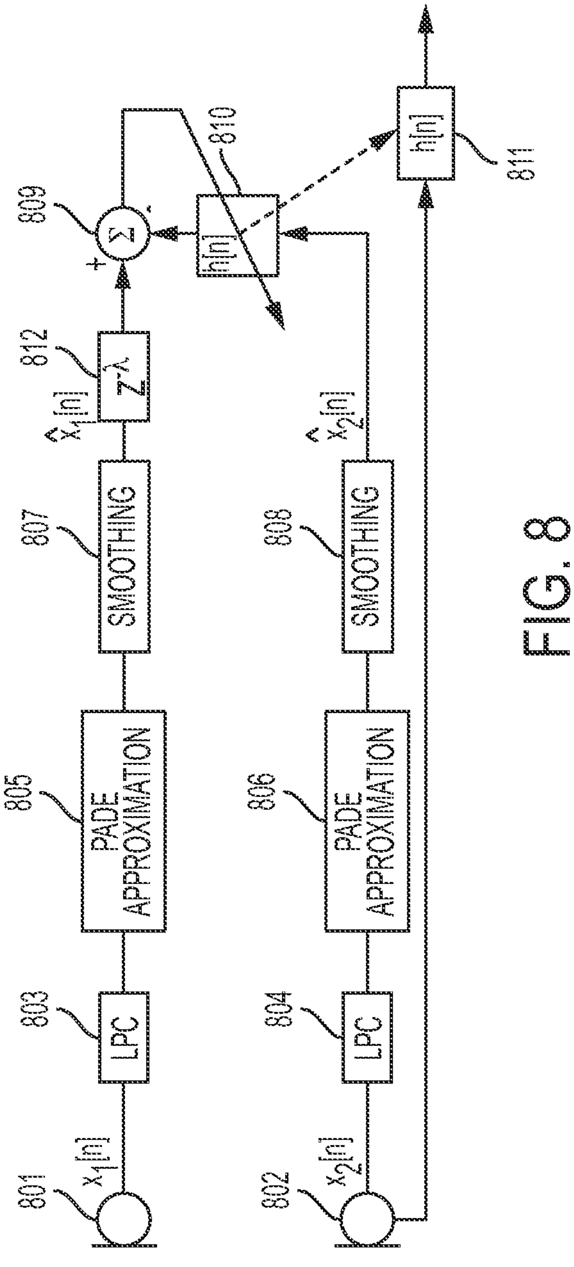
FIG. 8 is an example block diagram of an adaptive filter for equalizing a second signal to a first signal in the time domain in which the adaptive filter is based on a magnitude response of the first and second signals that is calculated in the time domain using auto-regressive modeling according to one embodiment of the disclosure.

An adaptive filter may be calculated using time domain approximations as shown in the system of FIG. 8. The system of FIG. 8 receives input signals $x_1[n]$ and $x_2[n]$ at nodes 801 and 802 from a first and second sensor, respectively. Nodes 801 and 802 are coupled to respective processing blocks 803 and 804. Processing blocks 803 and 805 calculate Linear Prediction Coefficients (LPC) for input signal $x_1[n]$, and processing blocks 804 and 806 calculate LPCs for input signal $x_2[n]$. In some embodiments, the LPCs are estimated using auto-regressive (AR) model parameters.

Processing block 803 is coupled to processing block 805, and processing block 804 is coupled to processing block 806. Processing blocks 805 and 806 receive the LPCs for input signals $x_1[n]$ and $x_2[n]$, respectively, and calculate a magnitude response difference between using the auto-regressive, moving average (ARMA) system coefficients of input signals $x_1[n]$ and $x_2[n]$. In some embodiments, processing blocks 805 and 806 then perform a Padé approximation using the ARMA coefficients to approximate a time domain impulse response that corresponds to the magnitude difference between input signals $x_1[n]$ and $x_2[n]$. In some embodiments, processing block 805 is further coupled to processing block 807, and processing block 806 is further coupled to processing block 808. Processing blocks 807 and 808 perform smoothing similar to that described with respect to blocks 507-510 of FIG. 5. In some embodiments, processing blocks 807 and 808 may also constrain the estimated time domain impulse response calculated in processing blocks 805 and 806 such that the time domain impulse response has a linear phase response. The constraining of the estimated time domain impulse response may be performed as described below by, for example, applying a filtering delay.

Processing block 807 is coupled to error signal processing block 809 where an error signal is calculated. Processing block 808 is coupled to adaptive filter 810 where the time domain impulse response coefficients are used to create an adaptive filter. The adaptive filter 810 is further coupled to error signal processing block 809 through a feedback loop.

The adaptive filter 810 creates filter h[n] that is applied in processing block 811 to the original input signal $x_2[n]$. Some embodiments may include a delay block 812 coupled between processing block 807 and error signal processing block 809 to calculate the delay of the time domain impulse response. The calculated delay from delay block 812 may be applied to the unfiltered signal (not shown in FIG. 8), $x_1[n]$, to keep input signals $x_1[n]$ and $x_2[n]$ synchronized after $x_2[n]$ is filtered by adaptive filter h[n] in processing block 811.

For example, in one embodiment, processing blocks 803 and 804 may calculate linear prediction coefficients (LPCs) based on the following equation:

$$\hat{x}(n)=\alpha_1^{(i)}x_i(n-1)+\alpha_2^{(i)}x_i(n-2)+\ldots\alpha_L^{(i)}x_i(n-L),$$

with $$\hat{X}_i(z)=(\alpha_1^{(i)}z^{-1}+\ldots+\alpha_L^{(i)}z^{-L})X_i(z),$$

and $$\hat{X}_i(z)=A_i(z)X_i(z).$$

The parameters $\alpha_1^{(i)}\ldots\alpha_L^{(i)}$ may be estimated using the Levinson's-Durbin algorithm through estimating the auto-correlation sequence based on the following equation:

$$\gamma_{x_ix_i}(m)=\frac{1}{N}\sum_{n=0}^{N-1}x_i(n)x_i(n-m)\quad m\text{: }0,\ldots L.$$

In some embodiments, the magnitude response difference calculated in processing blocks 805 and 806 may be defined as:

$$H(z)=\frac{A_2(z)}{A_1(z)}.$$

In some embodiments that calculated the LPC coefficients described above, the adaptive filter may be defined by the following equation:

$$H(z)=\frac{1+a_1^{(2)}z^{-1}+a_2^{(2)}z^{-2}+\ldots a_L^{(2)}z^{-L}}{1+a_1^{(1)}z^{-1}+a_2^{(1)}z^{-2}+\ldots a_L^{(1)}z^{-L}}$$

When processing blocks 805 and 806 apply a Pade approximation, the auto-regressive, moving average system (ARMA), represented by H(z), and the moving average, represented by, $\hat{H}(z)$ may be approximately equal as defined in the following equation:

$$H(z)\approx\hat{H}(z),$$

The approximation may then be expanded and represented as defined by the following equation:

$$\frac{1+a_1^{(2)}z^{-1}+a_2^{(2)}z^{-2}+\ldots a_L^{(2)}z^{-L}}{1+a_1^{(1)}z^{-1}+a_2^{(1)}z^{-2}+\ldots a_L^{(1)}z^{-L}}=b_0+b_1z^{-1}+b_2z^{-1}+\ldots b_Mz^{-M},$$

when M>>L. The coefficients $b_0\ldots b_M$ may then be solved by carrying the denominator on the left over to the right and equating the coefficients to create a linear system of equations.

The coefficients may be constrained to the linear phase, such as by applying a filtering delay. For example the approximation may then be expanded and represented by the following equation:

$$\frac{1+a_1^{(2)}z^{-1}+a_2^{(2)}z^{-2}+\ldots a_L^{(2)}z^{-L}}{1+a_1^{(1)}z^{-1}+a_2^{(1)}z^{-2}+\ldots a_L^{(1)}z^{-L}}=b_Mz^{-D+M}+\ldots b_2z^{-D+2}+b_1z^{-D+1}+b_0z^{-D}+b_1z^{-D-1}+b_2z^{-D-2}+\ldots b_Mz^{-D-M}.$$

A set of linear equations may similarly be formulated from this equation to equate polynomials, as discussed above to create set of constrained coefficients to be used in filter h[n] in processing blocks 810 and 811. The linear system of equations can then be solved to obtain the coefficients $b_0,\ldots,b_h$.

In some embodiments, the error signal calculated in error signal processing block 809 may be calculated based on the following equation:

$$e(n)=x_i(n)-\hat{x}_i(n).$$

In some environments, the input signal consists of noise and speech and the relative magnitude spectrum of the speech and the noise can be very different. In such scenarios, matching the magnitude spectrum at all times may cause undesirable results. Accordingly, some embodiments further include an adaptive enable input signal that controls the time instances in which any of the magnitude equalization processing blocks 803-811 are enabled. The adaptive filter h[n] in processing block 811 may be updated only when the adaptive enable input signal control signal is true because the input signals X[n] changes only when the magnitude equalization processing blocks are enabled.

The time domain adaptive filter and other components and methods described above may be implemented in an audio controller of a device, such as a mobile device, to process signals received from near and/or far microphones of the mobile device. The mobile device may be, for example, a mobile phone, a tablet computer, a laptop computer, or a wireless earpiece. A processor of the mobile device, such as the device's application processor, may implement a processing technique, such as those described above with reference to FIG. 2, FIG. 3, FIG. 4, FIG. 5, FIG. 7, and/or FIG. 8, or other circuitry for processing. Alternatively, the mobile device may include specific hardware for performing these functions, such as a digital signal processor (DSP). The controller may include the processor, digital signal processor (DSP), and/or other circuitry related to signal processing. In some embodiments, the controller may be integrated into an audio coder/decoder (CODEC) chip along with other audio processing circuitry, such as adaptive echo cancellation (AEC), adaptive noise cancellation (ANC), pulse width modulators (PWM), and/or audio amplifiers.

The schematic flow chart diagrams of FIG. 3, FIG. 4, FIG. 5, FIG. 7, and FIG. 8 are generally set forth as a logical flow chart diagram. As such, the depicted order and labeled steps are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

If implemented in firmware and/or software, functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can include random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A method, comprising:

receiving, by a processor coupled to a plurality of sensors, at least a first input signal and a second input signal in a time domain from the plurality of sensors;

converting, by the processor, the first and second input signals from the time domain to first and second frequency domain input signals;

estimating, by the processor, first and second time domain magnitude only equivalent signals based, at least in part, on the first and second frequency domain input signals;

filtering, by the processor using a time domain adaptive filter, the first time domain magnitude only equivalent signal to match the second time domain magnitude only equivalent signal;

updating, by the processor, coefficients for an impulse response of the adaptive filter to minimize a difference between the first and second time domain magnitude only equivalent signals;

constraining, by the processor, the updated coefficients of the adaptive filter such that the impulse response of the adaptive filter is constrained to have a linear phase response; and filtering, by the processor, at least one of the first input signal and the second input signal based, at least in part, on the constrained time domain impulse response.

2. The method of claim 1, further comprising repeating the steps of receiving, estimating, converting, constraining, updating, and filtering to provide adaptive equalization of the received input signals.

3. The method of claim 1, wherein the step of constraining comprises constraining the filter coefficients to be even symmetric and odd length, and wherein the step of filtering comprises applying the adaptive filter with the calculated and constrained filter coefficients.

4. The method of claim 1, further comprising delaying at least one of the first input signal and the second input signal that is not filtered based on the constrained time domain impulse response to compensate for a delay introduced by the filtering.

5. The method of claim 1, wherein the first input signal and the filtered second input signal are further filtered for spatial recognition.

6. The method of claim 1, wherein the first input signal and the filtered second input signal are further filtered for beamforming.

7. An apparatus, comprising:

a first input node configured to receive a first input signal;

a second input node configured to receive a second input signal;

a controller coupled to the first input node and coupled to the second input node and configured to perform steps comprising:

receiving the first input signal and the second input signal in a time domain;

converting the first and second input signals from the time domain to first and second frequency domain input signal;

estimating first and second time domain magnitude only equivalent signals based, at least in part, on the first and second frequency domain input signals;

filtering, using a time domain adaptive filter, the first time domain magnitude only equivalent signal to match the second time domain magnitude only equivalent signal;

updating coefficients for an impulse response of the adaptive filter to minimize a difference between the first and second time domain magnitude only equivalent signals;

constraining the updated coefficients of the adaptive filter such that the impulse response of the adaptive filter is constrained to have a linear phase response; and filtering at least one of the first input signal and the second input signal based, at least in part, on the constrained time domain impulse response.

8. The apparatus of claim 7, further comprising repeating the steps of receiving, estimating, converting, constraining, updating, and filtering to provide adaptive equalization of the received input signals.

9. The apparatus of claim 7, wherein the step of constraining comprises constraining the filter coefficients to be even symmetric and odd length, and wherein the step of filtering comprises applying the adaptive filter with the calculated and constrained filter coefficients.

10. The apparatus of claim 7, further comprising delaying at least one of the first input signal and the second input signal that is not filtered based on the constrained time domain impulse response to compensate for a delay introduced by the filtering.

11. The apparatus of claim 7, wherein the first input signal and the filtered second input signal are further filtered for spatial recognition.

12. The apparatus of claim 7, wherein the first input signal and the filtered second input signal are further filtered for beamforming.

13. A method, comprising:

receiving, by a processor from a plurality of sensors, at least a first input signal and a second input signal in a time domain;

computing, by the processor, auto-regressive (AR) model parameters of the input signals using linear prediction analysis;

computing, by the processor, auto-regressive moving average (ARMA) model parameters corresponding to a magnitude response difference between the two input signals;

computing, by the processor, a time domain impulse response corresponding to the magnitude response difference between the first input signal and the second input signal, wherein the time domain impulse response is calculated using a Padé approximation based, at least in part, on the auto-regressive model parameters and the auto-regressive moving average model parameters;

constraining, by the processor, the time domain impulse response to have a linear phase response; and filtering, by the processor, at least one of the first input signal and the second input signal based, at least in part, on the constrained time domain impulse response.

14. The method of claim 13, wherein the step of applying the linear prediction analysis comprises generating linear prediction coefficients.

15. The method of claim 13, wherein the first input signal and the second input signals comprise audio information received from a first microphone and a second microphone.

16. The method of claim 13, wherein the first input signal and the filtered second input signal are further filtered for spatial recognition.

17. The method of claim 13, wherein the first input signal and the filtered second input signal are further filtered for beamforming.

18. An apparatus, comprising:

a first input node configured to receive a first audio signal;

a second input node configured to receive a second audio signal;

a controller coupled to the first input node and coupled to the second input node and configured to perform steps comprising:

receiving the first input signal and the second input signal in a time domain;

computing, by the processor, the auto-regressive (AR) model parameters of the input signals using linear prediction analysis;

computing, by the processor, the auto-regressive moving average (ARMA) model parameters corresponding to a magnitude response difference between the two input signals;

computing, by the processor, a time domain impulse response corresponding to the magnitude response difference between the first input signal and second input signal, wherein the time domain impulse response is calculated using a Padé approximation based, at least in part, on the auto-regressive model parameters and the auto-regressive moving average model parameters;

constraining the time domain impulse response to have a linear phase response; and filtering at least one of the first input signal and the second input signal based, at least in part, on the constrained time domain impulse response.

19. The apparatus of claim 18, wherein the controller is further configured to generate linear prediction coefficients when computing the auto-regressive (AR) model parameters of the input signals by using linear prediction analysis.

20. The apparatus of claim 18, wherein the first input signal and the second input signals comprise audio information received from a first microphone and a second microphone.

21. The apparatus of claim 18, wherein the first input signal and the filtered second input signal are further filtered for spatial recognition.

22. The apparatus of claim 18, wherein the first input signal and the filtered second input signal are further filtered for beamforming.

* * * * *